(12) United States Patent
Mason et al.

(10) Patent No.: US 12,322,473 B2
(45) Date of Patent: Jun. 3, 2025

(54) DETERMINING READ VOLTAGE OFFSET IN MEMORY DEVICES

(71) Applicant: Micron Technology, Inc., Boise, ID (US)

(72) Inventors: Robert W. Mason, Boise, ID (US); Pitamber Shukla, Boise, ID (US); Steven Michael Kientz, Westminster, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/755,033

(22) Filed: Jun. 26, 2024

(65) Prior Publication Data

US 2024/0347084 A1    Oct. 17, 2024

Related U.S. Application Data

(63) Continuation of application No. 17/897,438, filed on Aug. 29, 2022, now Pat. No. 12,057,190.

(51) Int. Cl.
*G11C 16/10* (2006.01)
*G11C 7/10* (2006.01)
*G11C 7/22* (2006.01)

(52) U.S. Cl.
CPC .......... *G11C 7/1096* (2013.01); *G11C 7/1069* (2013.01); *G11C 7/109* (2013.01); *G11C 7/222* (2013.01)

(58) Field of Classification Search
CPC ...................................................... G11C 16/10
USPC ...................................................... 365/185.25
See application file for complete search history.

(56) References Cited

U.S. PATENT DOCUMENTS

2021/0182178 A1\* 6/2021 Ehama ................ G06F 11/3648

\* cited by examiner

*Primary Examiner* — Jason Lappas
(74) *Attorney, Agent, or Firm* — LOWENSTEIN SANDLER LLP

(57) ABSTRACT

Systems and methods are disclosed including a memory device and a processing device operatively coupled to the memory device. The processing device can perform operations including initializing the memory device; selecting at least one sample management unit on the memory device; performing a calibration operation on the sample management unit to determine a duration value reflecting a duration during which the memory device was powered down; adjusting an accumulator value based on the duration value; determining a read voltage value based on the accumulator value; and performing a read operation using the read voltage value.

20 Claims, 11 Drawing Sheets

| MODIFIER METADATA TABLE 310 | |
|---|---|
| Temp | Modifier Value |
| 0 °C | 0s |
| 10 °C | $x_1$s |
| 20 °C | $x_2$s |
| 30 °C | $x_3$s |
| ... | ... |
| n °C | $x_m$s |
| ... | ... |

FIG. 3

| PROGRAM METADATA TABLE 710 | |
|---|---|
| BLOCK ID | Accumulator Value |
| 0 | $A_1$ |
| 1 | $A_2$ |
| 2 | $A_3$ |
| 3 | $A_4$ |
| ... | ... |
| n | $A_m$ |
| ... | ... |

FIG. 7

| OFFSET VOLTAGE METADATA TABLE 910 ||
|---|---|
| Read Reference | Voltage Offset |
| $y_1$ | $z_1$ |
| $y_2$ | $z_2$ |
| $y_3$ | $z_2$ |
| $y_4$ | $z_3$ |
| ... | ... |
| $y_n$ | $z_m$ |
| ... | ... |

FIG. 9

DETERMINING READ VOLTAGE OFFSET IN MEMORY DEVICES

RELATED APPLICATION

This application a continuation of U.S. patent application Ser. No. 17/897,438, filed Aug. 29, 2022, the entire contents of which is hereby incorporated by reference herein.

TECHNICAL FIELD

Embodiments of the disclosure relate generally to memory sub-systems, and more specifically, relate to determining read voltage offset values in memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 3 illustrates example modifier metadata maintained by the memory device, in accordance with aspects of the present disclosure.

FIG. 7 illustrates example program metadata maintained by the memory device, in accordance with aspects of the present disclosure.

FIG. 9 illustrates example offset voltage metadata maintained by the memory device, in accordance with aspects of the present disclosure.

DETAILED DESCRIPTION

Figure 1:
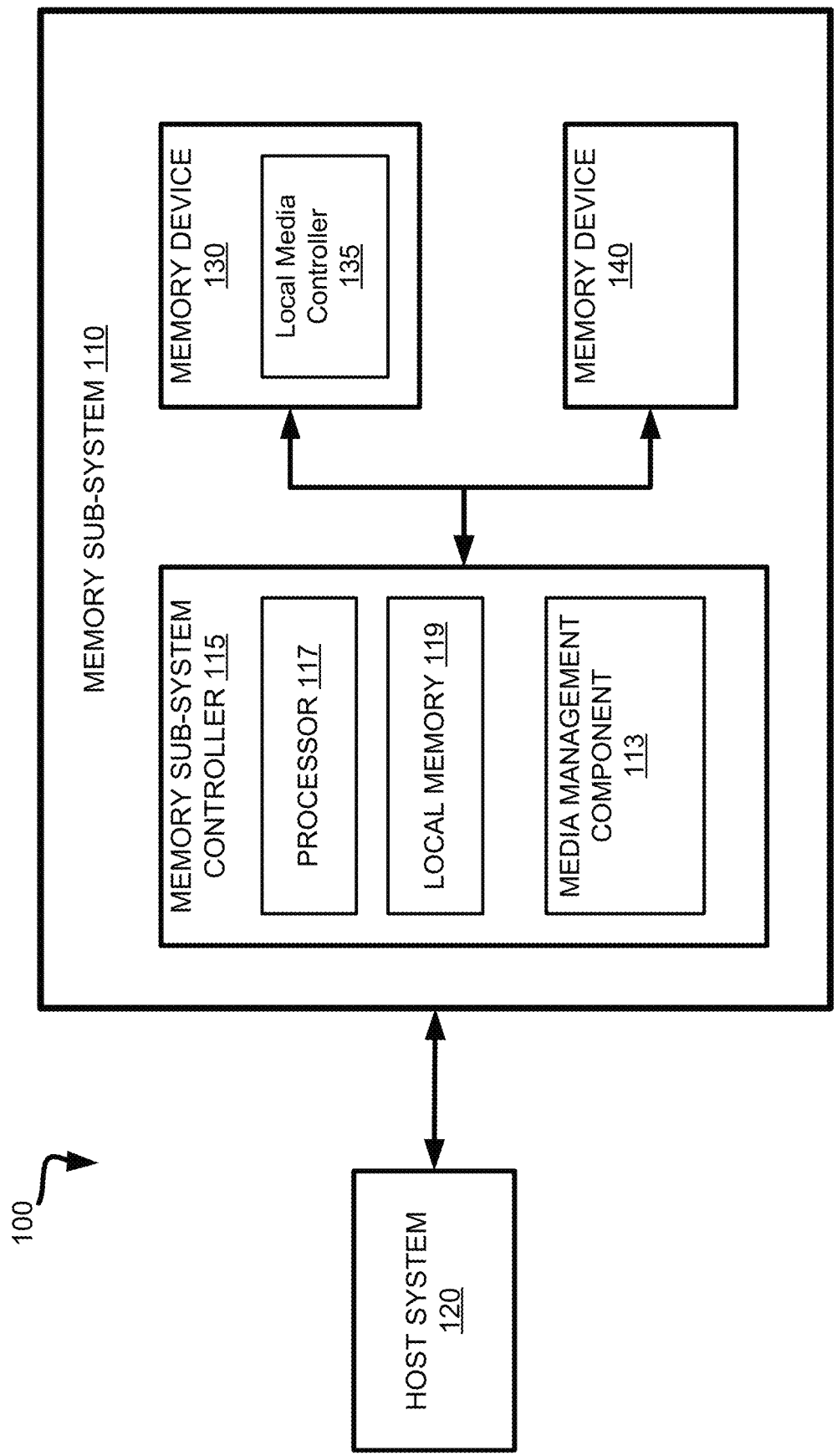
FIG. 1 illustrates an example computing system that includes a memory sub-system in accordance with some embodiments of the present disclosure.

Aspects of the present disclosure are directed to determining read voltage offset values in memory devices. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. One example of a non-volatile memory device is a negative-and (NAND) memory device. Other examples of non-volatile memory devices are described below in conjunction with FIG. 1. Each of the memory devices can include one or more arrays of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values.

Various data operations can be performed by the memory sub-system. The data operations can be host-initiated operations. For example, the host system can initiate a data operation (e.g., write, read, erase, etc.) on a memory sub-system. The host system can send data access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error-handling data (e.g., error correction code (ECC) codeword parity data), data version (e.g. used to distinguish age of data written), valid bitmap (which LBAs or logical transfer units contain valid data), etc.

A memory device includes multiple memory cells capable of storing, depending on the memory cell type, one or more bits of information. A memory cell can be programmed (written to) by applying a certain voltage to the memory cell, which results in an electric charge being held by the memory cell, which is called as the "threshold voltage" and denoted as Vt.

A memory device can have distributions that are narrow compared with the working range of control voltages tolerated by the cells of the device. Accordingly, multiple distributions (with "valleys" between distributions) can be fit into the working voltage window allowing storing and reliably detecting multiple bits per cell such as $2^3=8$ distributions (7 valleys) for triple level cell (TLC), $2^2=4$ distributions (3 valleys) for MLC etc. The distributions are interspersed with voltage intervals ("valley margins") between distributions where none (or very few) of the memory cells of the device have their threshold voltages. Therefore, such valley margins can be used to separate various charge states—the logical state of the cell can be determined by detecting, during a read operation by applying read voltages corresponding to each valley. This effectively allows a single memory cell to store multiple bits of information: a memory cell operated with $2^N$ distributions (which are also called levels) is capable of storing N bits of information. During the read operation, $2^N-1$ read voltages are applied to distinguish $2^N$ distributions. Specifically, the read operation can be performed by comparing the measured threshold voltage $V_T$ exhibited by the memory cell to one or more reference voltage levels corresponding to known valleys (e.g., centers of the valleys) of the memory device.

Due to the phenomenon known as slow charge loss (SCL), the threshold voltage $V_T$ of a memory cell can change with time as the electric charge of the cell is diminishing, the process sometimes referred to as "temporal voltage shift" (TVS). Since typical cells store negatively charged particles (electrons), the loss of electrons causes the voltage thresholds to shift along the voltage axis towards lower voltage thresholds $V_T$. The threshold voltages can change rapidly at first (immediately after the memory cell is programmed) while slowing down at larger times in an approximately log-linear or power-law fashion ($\Delta V_T(t) = -C*t^b$) with respect to the time t elapsed since the cell programming event. In some embodiments of the present disclosure, TVS can be mitigated by keeping track of the time elapsed since the programming event as well as of the environmental conditions of a particular memory partition (block, plane, etc.) such as temperature and associating a voltage offset $\Delta V_T$ per valley to be used during read operations, where the standard "base read level" threshold voltage $V_T$ (displayed by the cell immediately after programing) is modified by the voltage offset: $V_T \rightarrow V_T + \Delta V_T$ where $\Delta VT$ is negative due to charge loss.

In some systems, the memory sub-system controller communicates with the local media controller(s) of the memory device via a single communication channel, such as an Open NAND Flash Interface (ONFI) channel. The local media controller controls each die or set of dies (referred to as a package) of the memory device. In an example, the memory sub-system controller can issue read commands, write commands, and erase commands to the local media controller over the communication channel. Accordingly, to retrieve stored data, the memory sub-system controller first determines the block family associated with the read command. The memory sub-system controller then sends, to the local media controller, the read command and a specific read voltage value or read voltage offset value corresponding to a bin that is associated with the block family. Accordingly, sending these voltage values for each issue read command caused the memory device to incur significant performance penalties in latency due to data bus congestion.

Aspects of the present disclosure improve the efficiency of data retrieval by implementing a memory device capable of determining read voltage offset values. In particular, a controller (the memory sub-system controller or a local media controller of the memory device) can maintain an oscillator-driven accumulator. The accumulator can initially be set to 0 (e.g., upon boot up of the memory sub-system). At every predetermined clock value of the oscillator (at a predefined frequency where the predetermined clock value is a configurable parameter), the value of the accumulator can be incremented by a composite parameter value. For example, the controller can maintain an oscillator counter that tracks every clock measurement value emitted from the oscillator. In response to the oscillator counter satisfying a threshold criterion (e.g., a value of the oscillator counter being equivalent or exceeding a predetermined value, such as 500, 10,000, etc.), the controller can determine the composite parameter and reset the oscillator counter.

To determine the composite parameter value, the controller can obtain a temperature value from the thermal sensor coupled to the memory device. The controller can then perform a lookup in a reference table (e.g., metadata table) to obtain the temperature modifier value correlating to the temperature value, and modify (e.g., via a multiplication operation, an addition operation, etc.) a time value using the temperature modifier value. The time value can be the equal to the predetermined clock value (e.g., 500, 10,000, etc.), or a predetermined arbitrary value (e.g., 10). In an illustrative example, for a memory device temperature of 50 degrees Celsius, the temperature modifier value can be a multiplier of 1.3. Accordingly, the controller can multiply the time value (e.g., 10) by the multiplier value (e.g., 10*1.3=13) to determine the composite parameter value. The memory sub-system controller can then increase the value of the accumulator by the composite parameter value.

During a programming operation, the controller can store, in a reference table and in association with a block identifier (ID), the value of the accumulator at the time the block is programmed.

For each read operation, in response to receiving a read command referencing the block, the controller can determine a read reference value reflective of the difference between the current value of the accumulator and the value stored during the programming operation. The read reference value can be used to obtain a read voltage offset to be applied to a base read voltage value. In particular, the controller can obtain the current value of the accumulator (e.g., 100) and the value stored during the programming operation (e.g., 13). The controller can then generate the read reference value by subtracting the current value of the accumulator from the stored value (e.g., 100−13=87). The controller can reference a metadata table listing the corresponding read offset values for particular read reference values to obtain the read offset value. The listings in the metadata table can reflect experimental results used to determine, for particular read reference values, the read offset value to compensate for the temporal voltage shift on the stored charge. Upon obtaining the read offset value, the controller can generate a modified read voltage value by applying the read voltage offset value to the base read voltage value. The controller can then perform a read operation using the modified read voltage value.

Advantages of the present disclosure include, but are not limited to, an improved performance of the memory sub-system by decreasing the latency of issuing read commands by the memory sub-system. This can result in an improvement of performance of the memory sub-system, reduction of data bus congestion, and a decrease in power consumption by the memory sub-system. Furthermore, this can increase the lifespan of the memory sub-system. Although embodiments are described using memory cells of a NAND flash memory, aspects of the present disclosure can be applied to other types of memory sub-systems.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IOT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g. 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes a media management component 113 that can be used to issue data access requests (e.g., write commands, read commands, erase commands, etc.) in accordance with embodiments of the present disclosure. In some embodiments, the memory sub-system controller 115 includes at least a portion of the media management component 113. For example, the memory sub-system controller 115 can include a processor 117 (processing device) configured to execute instructions stored in local memory 119 for performing the operations described herein. In some embodiments, the media management component 113 is part of the host system 120, an application, or an operating system. The media management component 113 can manage memory device 130, as described in more detail herein below.

Figure 2:
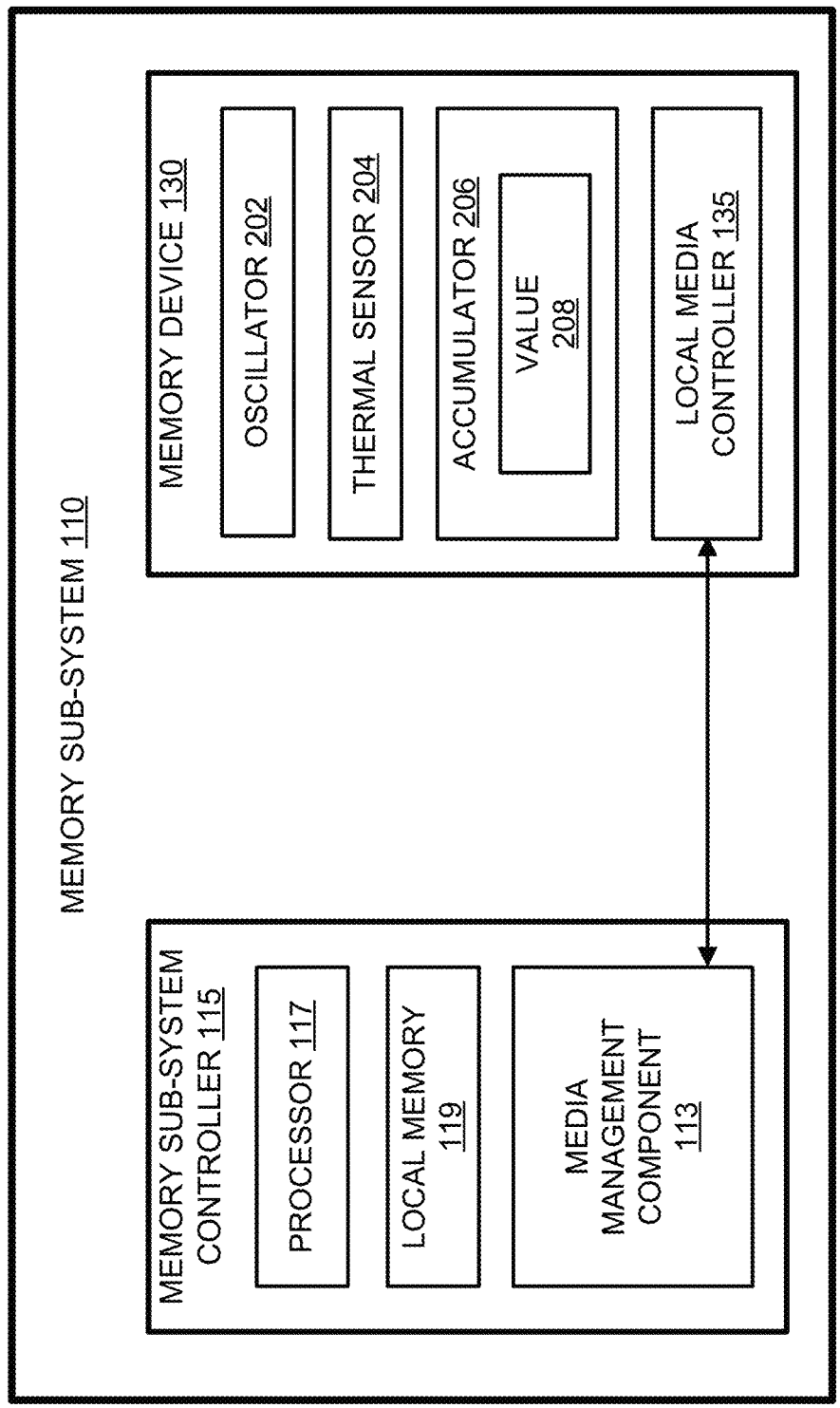
FIG. 2 illustrates example memory sub-system in accordance with some embodiments of the present disclosure.

FIG. 2 illustrates an example memory sub-system 110 in accordance with some embodiments of the present disclosure. Memory device 130 can include oscillator 202, thermal sensor 204, accumulator 206, and local media controller 135. In some embodiments, any or all of oscillator 202, thermal sensor 204, accumulator 206, can be components of the memory sub-system controller.

The oscillator 202 can generate a clock measurement value by emitting a cyclical clock pulse or signal. For example, oscillator 202 can be a ring oscillator that oscillates between two voltage levels, a crystal oscillator, etc. Local media controller 135 can maintain an oscillator counter that tracks every clock measurement value emitted from the oscillator.

The thermal sensor 204 can be any tool capable of generating temperature data (e.g., an operating temperature value of the memory sub-system). In some embodiments, the thermal sensor can be a thermocouple, a thermometer, an infrared sensor, etc. In some embodiments, the temperature-measuring device can be a hardware device that is coupled to and operated by the memory device 110. In some embodiments, the thermal sensor can be a hardware device that is coupled to and/or operated by the memory sub-system controller 115, or any other component of the memory sub-system 110. In such embodiments, the memory sub-system controller 115 can periodically send the temperature data to the memory device 130 and/or the memory device 130 can request (e.g., using polling or other request methods) the temperature data from the memory sub-system controller 115.

Accumulator 206 can maintain value 208 that is periodically updated by the local media controller 135. Initially (e.g., upon boot-up of the memory device), value 208 can be set to 0. At every predetermined clock value (e.g., at a predefined frequency) of oscillator 202, value 208 can be incremented by a composite parameter value. For example, in response to the counter satisfying a threshold criterion (e.g., a value of the oscillator counter being equivalent or exceeding a predetermined value), the controller can determine the composite parameter and reset the oscillator counter. The predetermined clock value can a configurable parameter (e.g., $10^{th}$ clock, $500^{th}$ clock, $1,000^{th}$ clock, 1,000,$000^{th}$ clock, etc.) reflecting an elapsed time. To generate the composite parameter value, local media controller 135 can first obtain a modifier value. A modifier value can be used to modify a time value (e.g., a value equal to the predetermined clock value, such as 500, 10,000, etc., or a predetermined arbitrary value) to compensate for die temperature, die wear, die age, etc. In particular, certain factors such as high temperature or excess wear on the die can accelerate temporal voltage shift on the stored charge. The modifier values can be used to adjust the time value such that these aggravating factor are accurately reflected in the composite value.

In some embodiments, local media controller 135 can modify the time value using a temperature modifier value that is based on the current temperature of the die. To determine the temperature modifier value, local media controller 135 can obtain a temperature value from the thermal sensor and use a reference table (e.g., temperature modifier metadata table 310 of FIG. 3) to obtain the temperature modifier value correlating to the particular temperature value. In particular, FIG. 3 schematically illustrates example temperature modifier metadata maintained by memory device 130, in accordance with aspects of the present disclosure. In some embodiments, local media controller 135 can maintain temperature modifier metadata table 310. In some embodiments, temperature modifier metadata table 310 can be stored in the local memory of the local media controller 135 and can be referenced by the local media controller 135 to determine a modifier value relating to a temperature value. In other embodiments, temperature modifier metadata table 310 can be stored in local memory 119. As illustrated by temperature modifier metadata table 310, each temperature value (e.g., 0° C., 10° C., 20° C., etc.) correlates to a particular temperature modifier value (e.g., 0s, $x_1$s, $x_2$s, etc.), where each temperature modifier value can be a value used, by local media controller 135, to modify the time value (e.g., via multiplication, addition, a formula, etc.). In particular, local media controller 135 can apply the temperature modifier value to the time value to generate a composite parameter value. For example, local media controller 135 can multiply the time value by the temperature modifier value, add the temperature modifier value to the time value, input the time value and the modifier value into a predetermined formula (e.g., a formula where the input includes at least the time value and the temperature modifier value, and the output include the composite parameter value), etc.

In some embodiments, local media controller 135 can modify the time value (or further modify the composite parameter value) using one or more of an age modifier value (reflective of the current age of the memory device or the expected lifespan), a defect modifier value (reflective of manufacturing defects of the die), a memory type modifier value (reflective of the type of memory used, such a SLC, QLC, etc.), etc. Each die can be assigned specific modifier values corresponding to the die's specific characteristics (e.g., age, defects, etc.). For example, in the memory device, one die can be assigned a defect modifier value to compensate for significant defects that increase temporal voltage shift, while another die can have few or no defect, thus not assigned a defect modifier value. The modifier values can be stored in respective metadata tables. The listings in the modifier metadata tables can reflect experimental results used to determine modifier values indicative of accelerated temporal voltage shift due to particular characteristics (e.g., increased temperature, die age, die defects, etc.). In some embodiments, these listings can be set during manufacturing or calibration of the memory sub-system. In some embodiments, these listings can be set or updated via, for example, a firmware update, operator input, etc.

Local media controller 135 can increase value 208 by the composite parameter value. Local media controller 135 periodically (e.g., at every predetermined clock of oscillator 202) generate a new composite value and update value 208 by adding the new composite value to the current value 208.

In some embodiments, the local media controller 135 can periodically store value 208 onto the non-volatile portion of the memory device. For example, the local media controller 135 can copy value 208 from the internal memory of the local media controller 135 (e.g., a cache) to the non-volatile portion of the memory device. By storing value 208 in the non-volatile memory, local media controller 135 can recover value 208 in response to the memory sub-system experiencing an asynchronous (i.e., unexpected) power loss. In some embodiments, the processing logic can store value 208 at predetermined intervals (e.g., every second, 10 seconds, etc.). In some embodiments, the local media controller 135 can store value 208 after each write operation is performed on the memory device. In some embodiments, the processing logic can store value 208 in response to the memory sub-system receiving a "shutdown" command.

Figure 4:
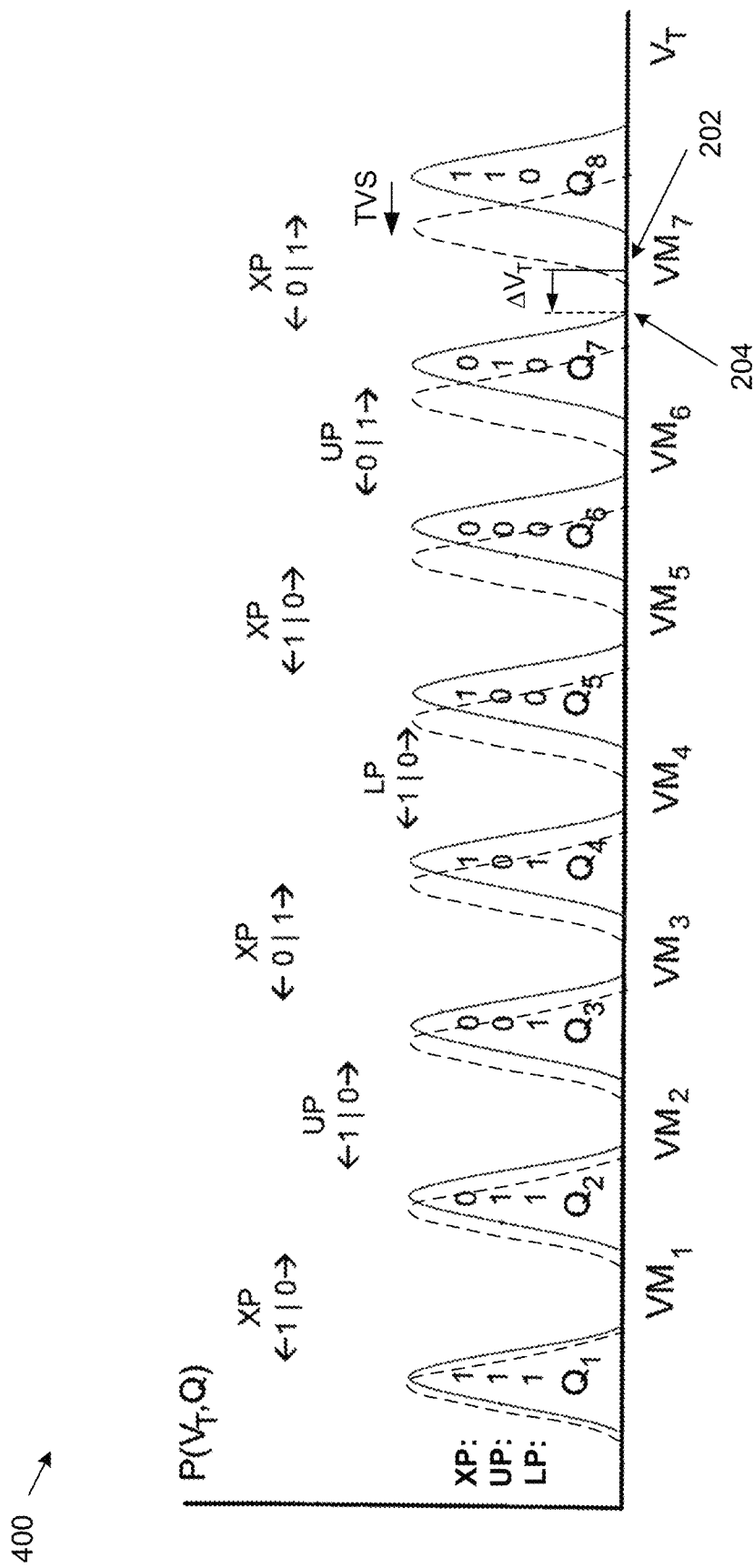
FIG. 4 illustrates schematically temporal voltage shift of a three-level memory cell capable of storing three bits of data by programming the memory cell into eight charge states that differ by the amount of charge on the cell's floating gate, in accordance with some embodiments of the present disclosure.

FIG. 4 illustrates schematically temporal voltage shift (TVS) of a three-level memory cell (TLC) capable of storing three bits of data by programming the memory cell into eight charge states $Q_k$ (also called levels) that differ by the amount of charge on the cell's storage gate, in accordance with some embodiments of the present disclosure. The distributions of threshold voltages P ($V_T$, $Q_k$) are separated with 7 valley margins $VM_n$. The cell programmed into k-th charge state ($Q_k$) can store a particular combination of 3 bits. For example, the charge state $Q_k$ can store the binary combination 101, as depicted. Other mapping of Qk to 3 bits can be used as well. This charge state $Q_k$ can be determined during a readout operation by detecting that a control gate voltage $V_{CG}$ within the valley margin $VM_k$ is sufficient to open the cell to the source-drain current whereas a control gate voltage within the preceding valley margin $VM_{k-1}$ is not. A memory cell can be configured to store N=1 bits (SLC), N=2 bits (MLC), N=3 bits (TLC), N=4 bits (QLC), and so on, depending on how many distributions can be fit (and interspersed with adequate-size valley margins) within the working range of the control gate voltages. Even though FIG. 4 depicts a TLC, the operations described in the present disclosure can be applied to any N-bit memory cells.

Memory cells are typically joined by wordlines (conducting lines electrically connected to the cells' control gates) and programmed together as memory pages (e.g., 16 KB or 32 KB pages) in one setting (by selecting consecutive bitlines connected to the cells' source and drain electrodes). As an example, FIG. 4 shows a scenario where 3 bits are programmed in 3 passes. Other programming sequences such as 1-pass and 2-pass programming can be used as well. For the example shown in FIG. 2, during a read operation, the memory controller 115 can determine that the applied control gate voltage $V_{CG}$ within the sixth valley margin $VM_6$ is not insufficient to open the cell to the source-drain electric current whereas the control gate voltage within the seventh valley margin $VM_7$ is sufficient to open the open the cell. Hence, the memory controller 115 can determine that the cell is in the charge state $Q_7$ corresponding to the logic state 010 (i.e. XP: 0, UP: 1, LP: 0).

The distributions of threshold voltages depicted with solid lines in FIG. 4 are distributions that the memory cells have immediately after programming. With the passage of time, as a result of a slow charge loss, the distributions shift (typically, towards lower values of $V_T$), as shown by the shifted valleys indicated with dashed lines. As a result, the threshold voltages of various memory cells are shifted by certain values $\Delta V_T$ that can depend on the time elapsed since programming, environmental conditions (e.g., ambient temperature), and so on. For optimal read operations, the controller 115 (or media management component 113) can, therefore, adjust the base read levels with the corresponding offsets $V_R \rightarrow V_R + \Delta V$ (where $\Delta V$ is usually less than zero), which are the same (or approximately the same) as the temporal voltage shifts. In one embodiment, the offsets can be determined (or estimated) as the difference between the center of the valley margin (such as the center 202 of $VM_7$) immediately after programming and the center of the same—but shifted—valley margin (such as the new center 204) at some later instance of time. As depicted schematically in FIG. 4, TVS of different distributions (valleys) and valley margins can differ from each other. In a typical scenario depicted in FIG. 4, TVS is greater for larger charges Q and smaller for lesser charges.

As shown in FIG. 4, the TVS in a memory device is a continuous process. In some embodiments, however, an adequate accuracy of voltage offsets can be achieved using a discrete set of read reference values, accordingly, a discrete set of voltage offsets $\Delta V$. In particular, the temporal voltage shift is determined using time values and/or composite values, and appropriate voltage offsets, which are based on corresponding read reference values, are applied to the base read levels in order to perform read operations. The read reference values can reflect the difference between a current time value or current composite value and the program composite value.

Figure 5:
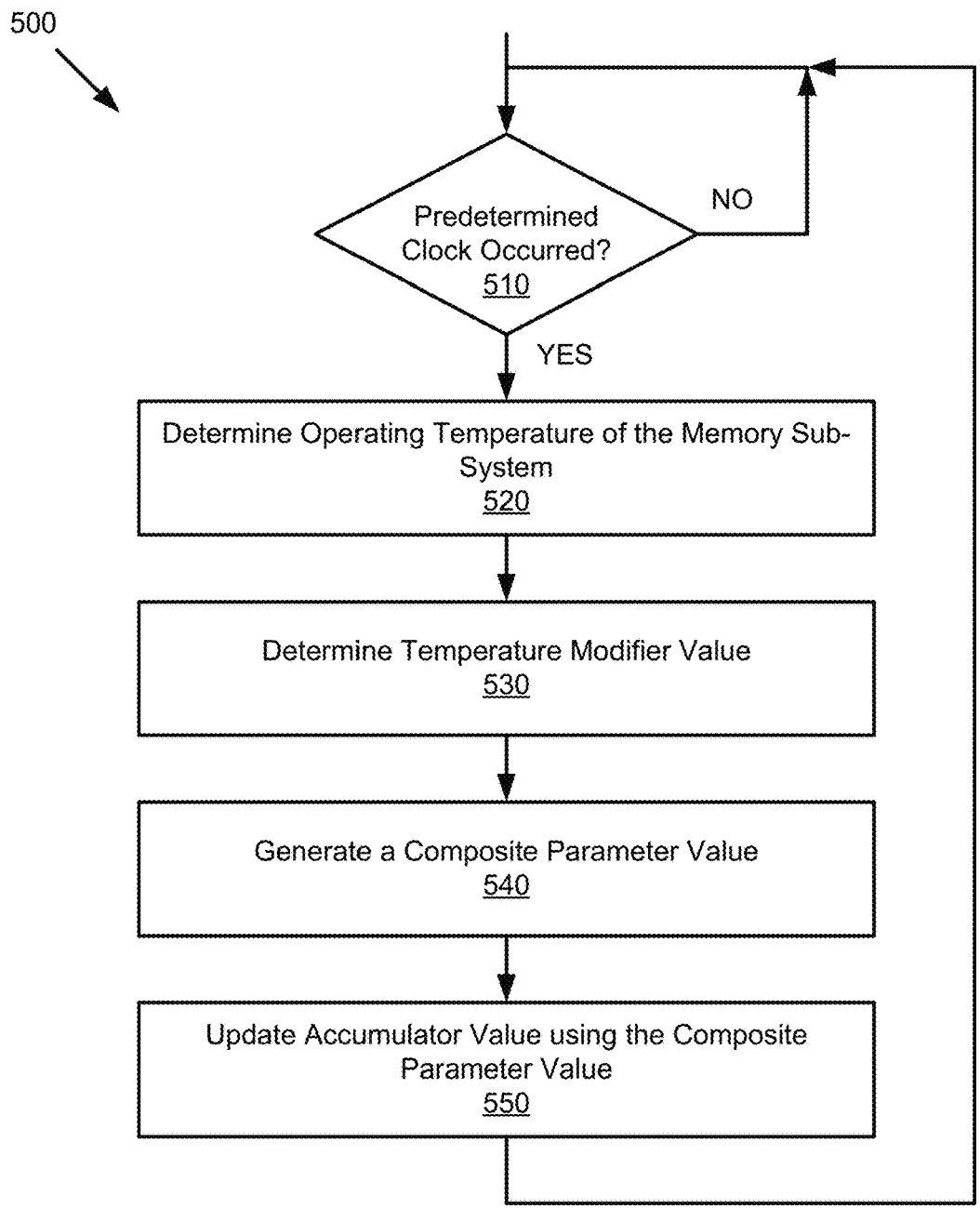
FIG. 5 is a flow diagram of an example method of updating the accumulator value, in accordance with some embodiments of the present disclosure

FIG. 5 is a flow diagram of an example method 500 for updating the accumulator value, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the local media controller 135 of FIG. 1, the memory sub-system controller 115 of FIG. 1, or any combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic determines whether the predetermined clock (or frequency) of the oscillator occurred. For example, the processing logic can determine whether the oscillator counter satisfies a threshold criterion (e.g., a value of the oscillator counter being equivalent or exceeding a predetermined value). Responsive to the predetermined clock of the oscillator occurring, the processing logic proceeds to operation 520.

At operation 520, the processing logic determines the operating temperature of the memory sub-system. In some embodiments, the processing logic determines the operating temperature of the memory device 130 by performing a temperature reading using thermal sensor 204. For example, the processing logic can obtain an operating temperature value from thermal sensor 204.

In some embodiments, the processing logic requests, from the memory sub-system controller (e.g., memory sub-system controller 115), the operating temperature value from a thermal sensor connected to the memory sub-system controller. In response to the request, the processing logic can receive, from the memory sub-system controller, the operating temperature value retrieved from the thermal sensor. In some embodiments, the processing logic obtains the operating temperature value using a polling method. For example, the processing logic can periodically request and/or receive, from the thermal sensor (on the memory device and/or the memory sub-system controller), an operating temperature value. The operating temperature value can be stored in, for example, a memory cache located on the memory sub-system controller 115 or memory device 130. To determine the temperature of the memory-subsystem at operation 520, the processing logic can retrieve the last received temperature value stored on the cache or register.

At operation 530, the processing logic determines a temperature modifier value corresponding to the operating temperature value. In some embodiments, the processing logic references a metadata table (e.g., temperature modifier metadata table 310) to obtain the modifier value. In some embodiments, the processing logic can obtain one or more additional modifier values corresponding to the age, expected lifespan, defects, or memory type of the die or memory device.

At operation 540, the processing logic generates a composite parameter value. The processing logic can modify the time value (using a multiplication operation, an addition operation, a formula, etc.) by the temperature modifier value (and/or one or more other modifier value) to generate the composite parameter value.

At operation 550, the processing logic updates the accumulator value using the composite parameter value. For example, the processing logic can add the composite value to the current accumulator value. The processing logic then proceeds to operation 510.

Figure 6:
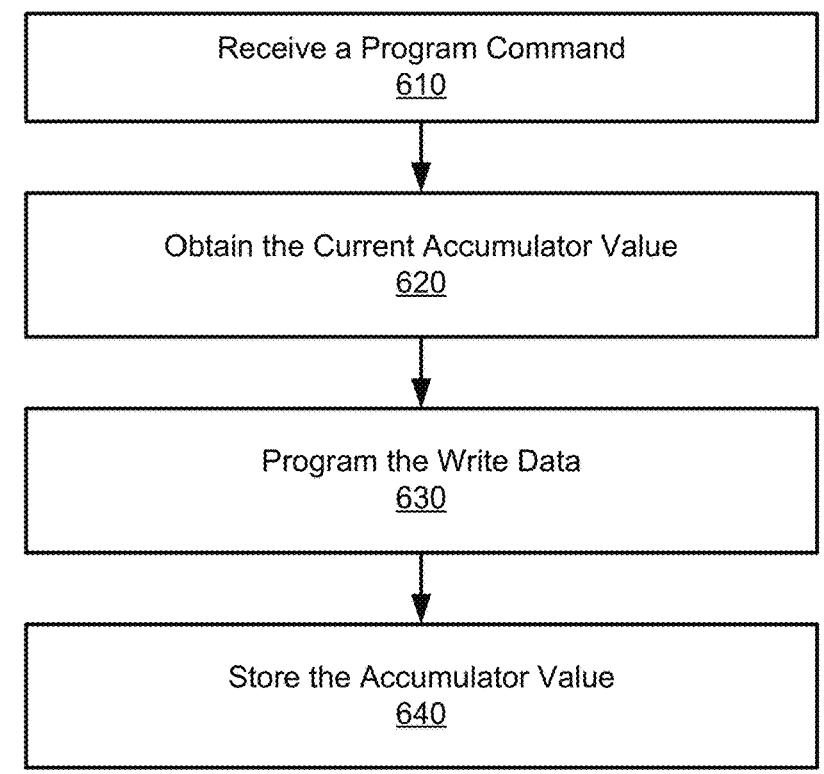
FIG. 6 is a flow diagram of an example method of performing a write operation by the memory device, in accordance with some embodiments of the present disclosure.

FIG. 6 is a flow diagram of an example method 600 for performing a program operation by the memory device, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the local media controller 135 of FIG. 1, the memory sub-system controller 115 of FIG. 1, or any combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing logic receives a program command. The program command can be initiated by a host (e.g., host 120) or by a memory sub-system controller (e.g., memory sub-system controller 113). In some embodiments, responsive to receiving the program command, the processing logic identifies one or more wordlines that address a set of memory cells (e.g., a page(s)) onto which to program the data referenced by the program command.

At operation 620, the processing logic obtains the current value of the accumulator. For example, the processing logic can sample the accumulator to obtain value 208. In some embodiments, the processing logic can determine an average accumulator value between the initiation and completion of the program operation. For example, the processing logic can obtain the accumulator value upon initiating the program operation, obtain another accumulator value upon completion of the program operation, and generate an average value reflecting the difference between the two accumulator values. In another example, the processing logic can obtain an accumulator value upon opening a block for programming, obtain another accumulator value upon closing the block, and generate an average accumulator value.

At operation 630, the processing logic programs the write data from the program command to the identified set of memory cells. For example, the write data can be retrieved from a memory device or a cache and programmed onto the memory cells. To program the write data, the processing logic can apply a certain voltage to each memory cell, which results in an electric charge being held by each memory cell.

At operation 640, the processing logic stores the accumulator value in a reference table. In some embodiments, the processing logic can store the accumulator value in a metadata table (e.g., program metadata table 710 of FIG. 7) in association with a block ID. In particular, FIG. 7 schematically illustrates example accumulator metadata maintained by the memory device, in accordance with aspects of the present disclosure. In some embodiments, local media controller 135 can maintain program metadata table 710. In some embodiments, program metadata table 710 can be stored in the local memory of the local media controller 135 and can be referenced by the local media controller 135 to determine, for a particular block, a stored accumulator value during a read operation. As illustrated by program metadata table 710, each block ID (e.g., block 0, block 1, etc.) correlates to a particular accumulator value (e.g., $A_1$, $A_2$, etc.) determined during method 600. Although the operations of method 600 are discussed with reference to blocks, it is noted that the operations of method 600 (and 800) can be performed with respect to other types of management units, such as a super block, a page, etc.

Figure 8:
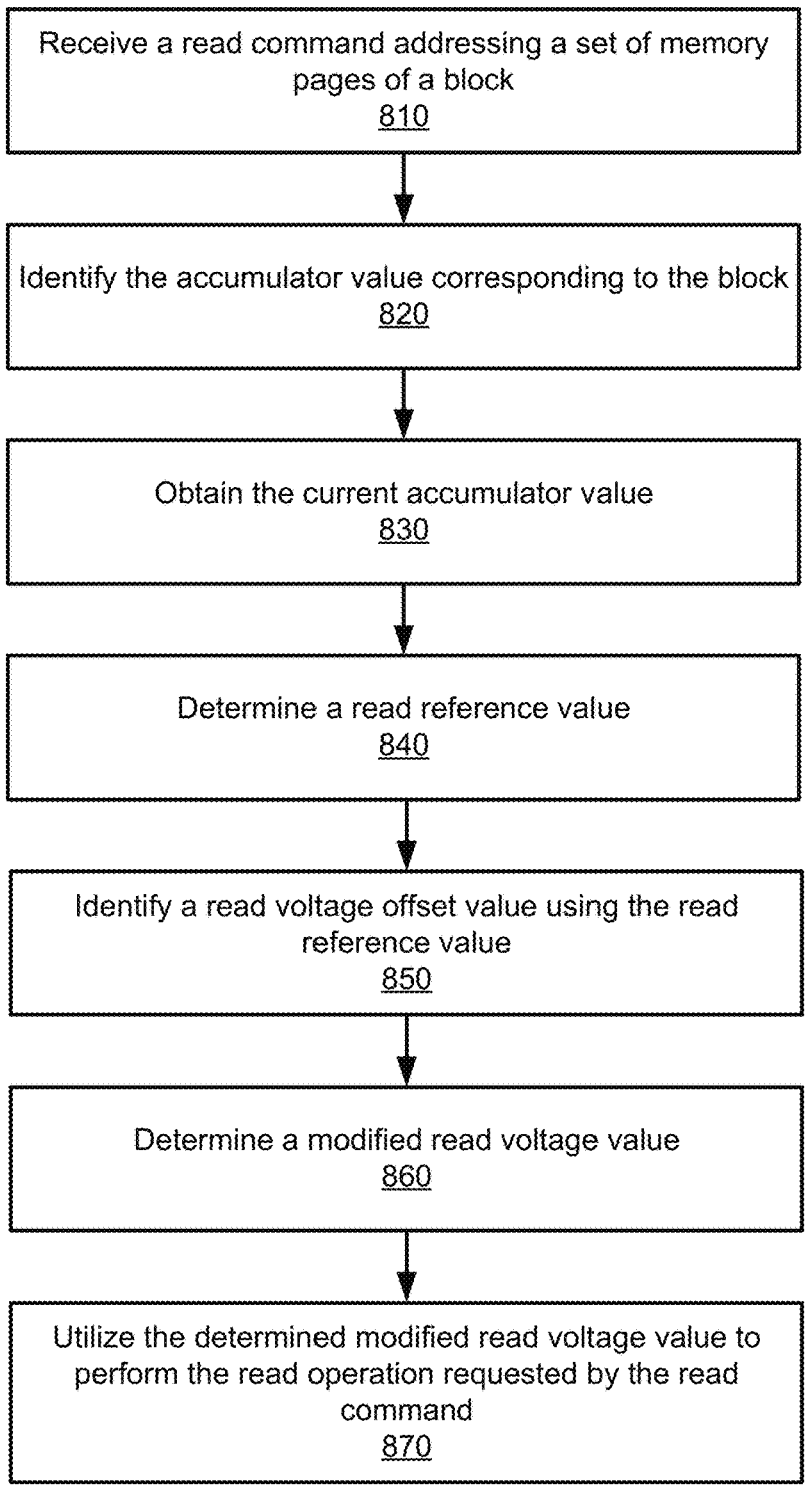
FIG. 8 is a flow diagram of an example method of performing a read operation by the memory device, in accordance with some embodiments of the present disclosure

FIG. 8 is a flow diagram of an example method 800 for performing a read operation by a memory device, in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the local media controller 135 of FIG. 1, the memory sub-system controller 115 of FIG. 1, or any combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, the processing logic receives a read command addressing a set of memory pages of a block. The set of memory pages can be addressed by a physical address.

At operation 820, the processing logic identifies an accumulator value corresponding the block. In an example, the processing logic references a metadata table (e.g., the program metadata table 710 of FIG. 7) to obtain the accumulator value correlating to the instance of the programming operation performed on the block.

At operation 830, the processing logic obtains the current composite value. For example, the processing logic can sample the accumulator to obtain the current value 208.

At operation 840, the processing logic determines a read reference value associated with the block. The read reference value can reflect the difference between the current accumulator value and the stored accumulator value corresponding to the block. In one example, the processing logic can then generate the read reference value by subtracting the current accumulator value from the stored accumulator value.

At operation 850, the processing logic identifies a read voltage offset value using the read reference value. To obtain the read voltage offset value, the processing logic can reference an offset metadata table (e.g., the offset voltage metadata table 910 of FIG. 9). In particular, FIG. 9 schematically illustrates example offset voltage metadata maintained by the memory device, in accordance with aspects of the present disclosure. In some embodiments, local media controller 135 can maintain offset voltage metadata table 910. In some embodiments, offset voltage metadata table 910 can be stored in the local memory of the local media controller 135 and can be referenced by the local media controller 135 to determine, for a read reference value, a voltage offset value. As illustrated by offset voltage metadata table 910, each read reference value (e.g., $y_1$, $y_2$, etc.) correlates to a particular voltage offset value (e.g., $z_1$, $z_2$, etc.). Offset voltage metadata table 910 can be generated during manufacturing or calibration of the memory sub-system, or can be generated and updated via user input.

At operation 860, the processing logic determines a modified read voltage value by applying the identified read voltage offset value to a base read voltage value associated with the memory device. The base read level voltage can be stored in the metadata area of the memory device.

At operation 870, the processing logic utilizes the determined modified read voltage value to perform the read operation requested by the read command. Responsive to completing operation 870, the method terminates.

Figure 10:
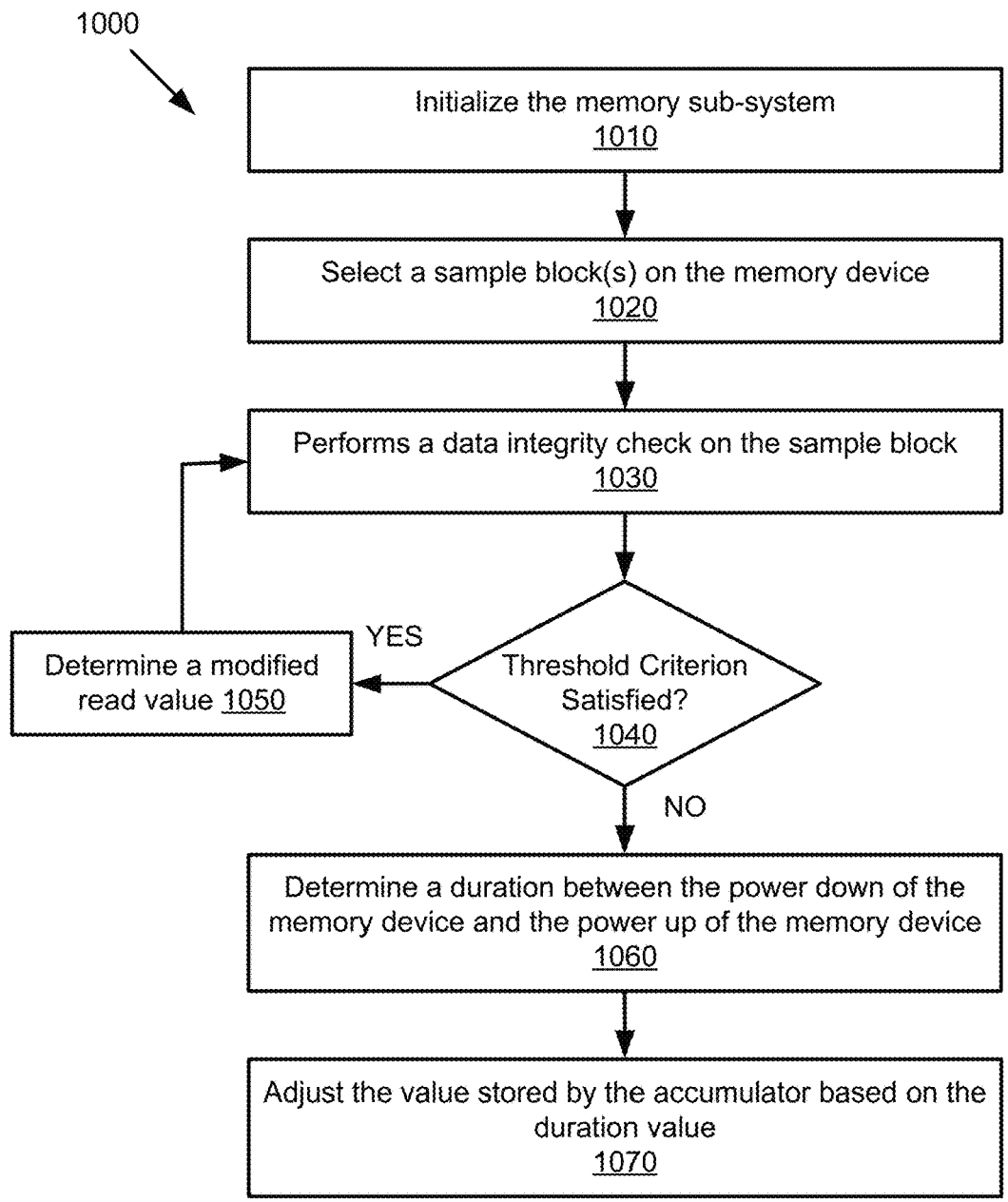
FIG. 10 is a flow diagram of an example method of time value recovery operation in response to a power loss by a memory device, in accordance with some embodiments of the present disclosure.

FIG. 10 is a flow diagram of an example method 1000 for performing a time value recovery operation in response to a power down by a memory device, in accordance with some embodiments of the present disclosure. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the media management component 113 of FIG. 1, the local media controller 135 of FIG. 1, or any combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Method 1000 can be performed to bring up to date value 208 stored by accumulator 206. In particular, during a power down, the memory sub-system may be unable to update value 208 due to power loss. However, slow charge loss can continue during a power down. Once value 208 is updated, the memory sub-system can account for the slow charge loss by accurately determining how long of a duration occurred between program and read operations, as discussed in methods 600 and 800.

At operation 1010, the processing logic initializes the memory sub-system. For example, the processing logic can perform a boot-up operation(s) in response to the memory sub-system powering up. The processing logic can further retrieve a last stored accumulator value, and set the value of the accumulator to the retrieve value. For example, the processing logic can retrieve the accumulator value stored on the non-volatile memory of the memory device.

At operation 1020, the processing logic selects a sample block(s) (or management unit) on the memory device. In some embodiments, the sample blocks can be one or more random blocks. In some embodiments, the sample block can be one or more predetermined reference blocks.

At operation 1030, the processing logic performs a data integrity check on the sample block. The processing logic can perform the data integrity check on one, some, or all of the pages of the sample block(s). In some embodiments, the data integrity check can include reading data from the set of sampled memory cells in the sample block. In some embodiments, the set of sampled memory cells in the source block can be one or more memory cells of the block, a page, a group of pages in the block, a wordline, a group of wordlines in the block, or any combination thereof. In some embodiments, the set of sampled memory cells can be selected randomly, can be a predetermined group (e.g., the first, twentieth, and fortieth wordlines of a block), can be a rotating group, etc.

To perform the data integrity check, the processing logic can read the data from the sample block using a boot-up read voltage value. The boot-up read value can a last read voltage value use prior to the power down, a predetermined read voltage value to be used during method 1000, a "best-guess" read voltage value based on an estimate of how long the memory device was powered down, etc.

The data integrity check can verify that the data stored at memory cells does not include any errors, or that the number of errors are below a predetermined threshold. During a scan operation, the processing logic identifies one or more data integrity metrics, such as the bit error count (BEC) or the raw bit error rate (RBER), representing a number of bit errors per unit of time that the data stored at the data block experiences. In some embodiments, during the data integrity check, the processing logic reads a raw code word (i.e., a series of a fixed number of bits) from the page. The processing logic can apply the code word to an error correcting code (ECC) decoder to generate a decoded code word and compare the decoded code word to the raw code word. The processing logic can count a number of flipped bits between the decoded code word and the raw code word, with a ratio of the number of flipped bits to the total number of bits in the code word representing the RBER.

At operation 1040, the processing logic determines whether a value of the data integrity metric (e.g., a BEC value, a RBER value, etc.) satisfies a threshold criterion (e.g., meets or exceeds a threshold value, is lower than a threshold value, etc.). The threshold criterion can be determined and set during manufacturing of the memory sub-system 110 or during programming and/or calibration of the memory sub-system 110. In an example, the processing logic can determine whether an RBER value or a BEC value exceeds a threshold value. If the data integrity metric satisfies a threshold criterion (e.g., BEC or RBER value is above a threshold value), indicating a high error rate associated with data stored at the block, the processing logic proceeds to operation 1050. If the data integrity metric fails to satisfy the threshold criterion (e.g., BEC or RBER value is below a threshold value), the processing logic proceeds to operation 1060.

At operation 1050, the processing logic determines a modified read value by applying a read voltage offset value to the boot-up read voltage value. The read voltage offset value can be selected based on an error-handling flow, on a predetermined set of operations, on a predetermined set of read offset values, etc. The processing logic then proceeds to operation 1030 and performs another data integrity check on the sample block using the modified read value. The processing logic may continue generating modified read value until data obtained from a read operation passes a data integrity check.

At operation 1060, the processing logic determines a duration between the power down of the memory device and the power up of the memory device based on the calibration to the boot-up read voltage value. In some embodiments, the processing logic can reference a calibration metadata table to determine the duration based on how much of a read voltage offset value was applied to the boot-up read voltage value. For example, if the initial boot-up read voltage value passed the data integrity check, then this can indicated that a minimal or negligible duration has passed from power down to power up of the memory device. If a particular read voltage offset value was applied to the boot-up read voltage value, then the calibration metadata table can include an entry indicating the corresponding duration reflective of said offset value.

At operation 1070, the processing logic adjusts the value stored by the accumulator based on the duration value. For example, the processing logic can add a value reflective of the duration value to the current accumulator value.

Figure 11:
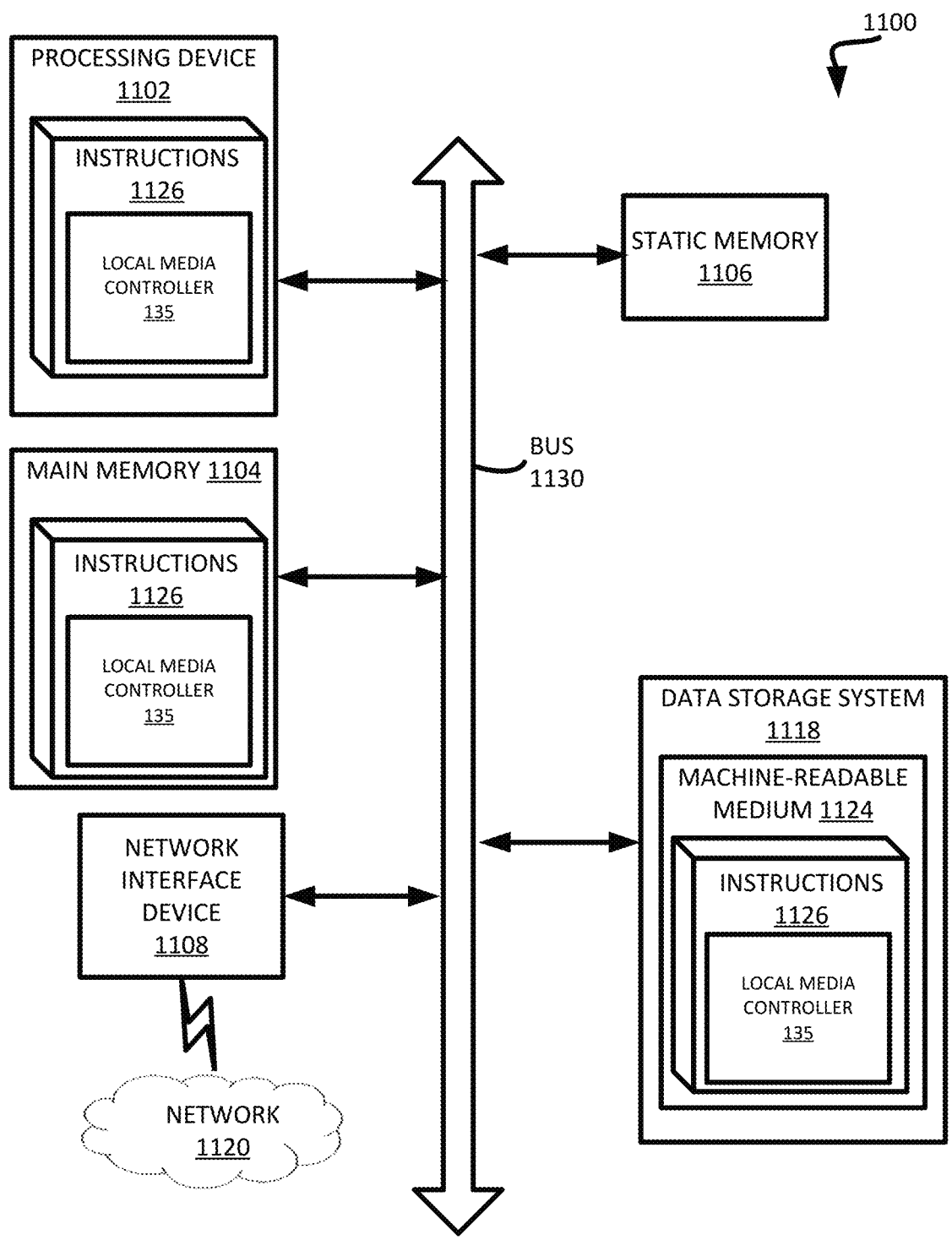
FIG. 11 is a block diagram of an example computer system in which embodiments of the present disclosure can operate.

FIG. 11 illustrates an example machine of a computer system 1100 within which a set of instructions, for causing the machine to perform any one or more of the methodologies discussed herein, can be executed. In some embodiments, the computer system 1100 can correspond to a host system (e.g., the host system 120 of FIG. 1) that includes or utilizes a memory sub-system (e.g., the memory sub-system 110 of FIG. 1) or can be used to perform the operations of a controller (e.g., to execute an operating system to perform operations corresponding to error-handling flow management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM) or Rambus DRAM (RDRAM), etc.), a static memory 1106 (e.g., flash memory, static random access memory (SRAM), etc.), and a data storage system 1118, which communicate with each other via a bus 1130. Processing device 1102 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 can also be one or more special-purpose processing devices such as an application specific integrated circuit (ASIC), a field programmable gate array (FPGA), a digital signal processor (DSP), network processor, or the like. The processing device 1102 is configured to execute instructions 1126 for performing the operations and steps discussed herein. The computer system 1100 can further include a network interface device 1108 to communicate over the network 1120.

The data storage system 1118 can include a machine-readable storage medium 1124 (also known as a computer-readable medium) on which is stored one or more sets of instructions 1126 or software embodying any one or more of the methodologies or functions described herein. The instructions 1126 can also reside, completely or at least partially, within the main memory 1104 and/or within the processing device 1102 during execution thereof by the computer system 1100, the main memory 1104 and the processing device 1102 also constituting machine-readable storage media. The machine-readable storage medium 1124, data storage system 1118, and/or main memory 1104 can correspond to the memory sub-system 110 of FIG. 1.

In one embodiment, the instructions 1126 include instructions to implement functionality corresponding to local media controller 135 of FIG. 1. While the machine-readable storage medium 1124 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device operatively coupled to the memory device, to perform operations comprising:
    initializing the memory device;
    selecting at least one sample management unit on the memory device;
    performing a calibration operation on the sample management unit to determine a duration value reflecting a duration during which the memory device was powered down;
    adjusting an accumulator value based on the duration value;
    determining a read voltage value based on the accumulator value; and
    performing a read operation using the read voltage value.

2. The system of claim 1, wherein the operations further comprise:

responsive to receiving a clock measurement value from an oscillator, incrementing a oscillator counter; and responsive to a value of the oscillator counter satisfying a threshold criterion, incrementing the value stored in the accumulator by a composite parameter value.

3. The system of claim 1, wherein determining the read voltage value comprises:

determining a read reference value based on the accumulator value based on the duration value;

identifying a read voltage offset value associated with the sample management unit using the read reference value; and applying the identified read voltage offset value to a base read voltage value associated with the memory device.

4. The system of claim 1, wherein the operations further comprise:

periodically, at a predefined frequency, incrementing the accumulator value by a composite parameter value, wherein the composite parameter value is equal to a multiplicative product of a predefined time period corresponding to the predefined frequency and a temperature modifier value derived from a current operating temperature of the memory device.

5. The system of claim 1, wherein the processing device is to perform further operations comprising:

periodically storing, to a non-volatile portion of the memory device, a current value of the accumulator.

6. The system of claim 1, wherein the operations further comprise:

maintaining a modifier metadata table comprising a plurality of entries each referencing a temperature value and a corresponding temperature modifier value.

7. The system of claim 1, wherein the operations further comprise:

maintaining an offset metadata table comprising a plurality of entries each referencing a read reference value and a corresponding voltage offset value.

8. A method, comprising:

initializing, by a processor, a memory device;

selecting at least one sample management unit on the memory device;

performing a calibration operation on the sample management unit to determine a duration value reflecting a duration during which the memory device was powered down;

adjusting an accumulator value based on the duration value;

determining a read voltage value based on the accumulator value; and performing a read operation using the read voltage value.

9. The method of claim 8, further comprising:

responsive to receiving a clock measurement value from an oscillator, incrementing a oscillator counter; and responsive to a value of the oscillator counter satisfying a threshold criterion, incrementing the value stored in the accumulator by a composite parameter value.

10. The method of claim 8, wherein determining the read voltage value comprises:

determining a read reference value based on the accumulator value based on the duration value;

identifying a read voltage offset value associated with the sample management unit using the read reference value; and applying the identified read voltage offset value to a base read voltage value associated with the memory device.

11. The method of claim 8, further comprising:

periodically, at a predefined frequency, incrementing the accumulator value by a composite parameter value, wherein the composite parameter value is equal to a multiplicative product of a predefined time period corresponding to the predefined frequency and a temperature modifier value derived from a current operating temperature of the memory device.

12. The method of claim 8, further comprising:

periodically storing, to a non-volatile portion of the memory device, a current value of the accumulator.

13. The method of claim 8, further comprising:

maintaining a modifier metadata table comprising a plurality of entries each referencing a temperature value and a corresponding temperature modifier value.

14. The method of claim 8, further comprising:

maintaining an offset metadata table comprising a plurality of entries each referencing a read reference value and a corresponding voltage offset value.

15. A non-transitory computer-readable storage medium comprising instructions that, when executed by a processing device operatively coupled to a memory, performs operations comprising:

initializing a memory device;

selecting at least one sample management unit on the memory device;

performing a calibration operation on the sample management unit to determine a duration value reflecting a duration during which the memory device was powered down;

adjusting an accumulator value based on the duration value;

determining a read voltage value based on the accumulator value; and performing a read operation using the read voltage value.

16. The non-transitory computer-readable storage medium of claim 15, wherein the operations further comprise:

responsive to receiving a clock measurement value from an oscillator, incrementing a oscillator counter; and responsive to a value of the oscillator counter satisfying a threshold criterion, incrementing the value stored in the accumulator by a composite parameter value.

17. The non-transitory computer-readable storage medium of claim 15, wherein determining the read voltage value comprises:

determining a read reference value based on the accumulator value based on the duration value;

identifying a read voltage offset value associated with the sample management unit using the read reference value; and applying the identified read voltage offset value to a base read voltage value associated with the memory device.

18. The non-transitory computer-readable storage medium of claim 15, wherein the operations further comprise:

periodically, at a predefined frequency, incrementing the accumulator value by a composite parameter value, wherein the composite parameter value is equal to a multiplicative product of a predefined time period corresponding to the predefined frequency and a temperature modifier value derived from a current operating temperature of the memory device.

19. The non-transitory computer-readable storage medium of claim 15, wherein the operations further comprise:

periodically storing, to a non-volatile portion of the memory device, a current value of the accumulator.

20. The non-transitory computer-readable storage medium of claim 15, wherein the operations further comprise:
maintaining a modifier metadata table comprising a plurality of entries each referencing a temperature value and a corresponding temperature modifier value.

\* \* \* \* \*